(12) United States Patent
Freitas

(10) Patent No.: US 6,252,432 B1
(45) Date of Patent: Jun. 26, 2001

(54) DIFFERENTIAL-INPUT/SINGLE-ENDED-OUTPUT TRANSLATOR

(75) Inventor: Oscar W. Freitas, Cape Elizabeth, ME (US)

(73) Assignee: Fairchild Semiconductor Corp., South Portland, ME (US)

( * ) Notice: Subject to any disclaimer, the term of this patent is extended or adjusted under 35 U.S.C. 154(b) by 0 days.

(21) Appl. No.: 09/267,739

(22) Filed: Mar. 15, 1999

Related U.S. Application Data

(60) Provisional application No. 60/081,697, filed on Apr. 14, 1998.

(51) Int. Cl.[7] .................................................. H03K 5/22
(52) U.S. Cl. ............................... 327/65; 327/52; 330/253
(58) Field of Search .................................. 327/65, 50, 51, 327/52, 63, 66, 69, 70; 330/252, 253, 257, 277

(56) References Cited

U.S. PATENT DOCUMENTS

| | | | |
|---|---|---|---|
| 4,728,900 | * | 3/1988 | Nakagarawa et al. ............... 330/253 |
| 5,245,223 | * | 9/1993 | Lim et al. ............................... 327/80 |
| 5,491,455 | | 2/1996 | Kuo . |
| 5,764,086 | * | 6/1998 | Nagamatsu et al. .................... 327/65 |
| 5,913,181 | * | 6/1999 | Ezell ....................................... 702/65 |

* cited by examiner

Primary Examiner—Timothy P. Callahan
Assistant Examiner—Hai L. Nguyen
(74) Attorney, Agent, or Firm—Pierce Atwood; Chris A. Caseiro

(57) ABSTRACT

A CMOS-based circuit for translating a differential-input into a single-ended output capable of driving large loads with little or no compromise in speed. This translator provides a symmetric single-ended output signal capable of driving a wide range of loads with minimal distortion. In contrast to earlier such translators, the circuit of the present invention ensures that the output signal is coupled directly to the high-voltage rail after being switched to logic HIGH and that that coupling remains in effect until an input signal causing the output to switch to logic LOW is received. Similarly, when the output signal is switched to logic LOW, it is coupled directly to the low-voltage rail of the circuit and left so coupled until it is affirmatively switched to logic HIGH. This feature ensures that regardless of load, the output signal completely switches to the proper logic stage.

15 Claims, 4 Drawing Sheets

DIFFERENTIAL-INPUT/SINGLE-ENDED-OUTPUT TRANSLATOR

CROSS REFERENCE TO RELATED PROVISIONAL APPLICATION

This application is filed claiming the benefit of U.S. Provisional Application No. 60/081,697 filed on Apr. 14, 1998, and assigned to Fairchild Semiconductor Corporation.

BACKGROUND OF THE INVENTION

1. Field of the invention

The present invention relates to the field of differential-to-single-ended translator circuits. More particularly, the present invention relates to such translator circuits that are CMOS-based. More particularly yet, the present invention relates to such CMOS translators where speed is of the essence, yet the translator design must be usable over a wide range of output loads. Most particularly, the present invention relates to such CMOS translator circuits needed to function under conditions requiring such translators to operate at very high speed while driving large output loads.

2. Prior Art

Differential-to-single-ended translators are used in a variety of applications to convert a differential input signal into a single-ended output signal. The differential input signal will be provided by two lines that in general have no well-defined reference level, and may in general be floating, where the input signal equals the difference in potential between the two lines. The single-ended output is referenced to a fixed potential, typically ground. In general, the signal is a digital one, consisting of a series of logic-high and logic-low values. Apart from providing differential-to-single conversion, these translators are also used to increase the amplitude of the incoming signal pair, to the extent necessary, in order to provide a signal that is robust enough to be useful in subsequent stages. For purposes of describing the background and novelty of the present invention, the term "translator," unless qualified further, will be used to refer to a differential-input-to-single-ended-output translator. Furthermore, the term will be limited to such translators that are MOSFET-based rather than bipolar-transistor-based. At places, the translator will be discussed as a combination of an input amplifier stage and a converter stage, the input amplifier stage producing an intermediate differential signal that is amplified with respect to the input differential signal, and the converter stage doing the actual conversion of the (amplified) differential signal to a single-ended signal.

Kuo (U.S. Pat. No. 5,491,455 issued Feb. 13, 1996, and assigned to National Semiconductor Corporation) sets out a CMOS translator. FIG. 1 (Prior Art) illustrates the heart of the Kuo translator circuit, with the input amplifier stage not shown. Unfortunately for general applications, the circuit taught by Kuo does not function properly under certain output load situations. Furthermore, there is an asymmetry in the operation of the Kuo translator that limits its use in other ways. However, the most serious problem is that of dealing with large loads. With reference to FIG. 1, it can be seen that the single-ended output of the translator goes into an inverter. The larger the inverter the greater the capacitive loading on Vout and the longer it takes to drive Vout (and the inverter input) HIGH. (It is with the transition LOW to HIGH that the problem arises, rather than existing for both transitions, one of the consequences of the asymmetry of the Kuo translator.) Now, it is inherent in the Kuo circuit that the current driving Vout HIGH is provided for a limited time interval following a logic switch in the input signal, and that after that the current is cut off. It can happen, therefore, that before sufficient drive current has been supplied to make Vout HIGH, this cutoff occurs, leaving Vout floating somewhere between LOW and HIGH. This has obvious detrimental consequences for the operation of any circuit depending on the translator.

One fix to the problem is to use a series of CMOS invertors. This allows a large total gain without requiring that Vout look into a single large capacitance. A series of small-area invertors can give the same overall gain as a single large-area inverter, while appearing to Vout to have just the capacitance of the initial one. This solution is workable as long as the circuit in which the translator is being used can tolerate the reduced switching speed that interposing a series of invertors in the signal path leads to. Of course, even under those tolerant circumstances, the use of a number of real-estate-consuming invertors is generally not desirable.

To see in particular the problem with the Kuo translator, refer again to FIG. 1. This is the converter stage of that translator. Consider IN switched LOW (and IN_BAR HIGH). The input IN then turns off N5 and N4. IN_BAR HIGH turns N2 and N3 on. The drain of N3 is LOW because of the coupling through initially-on N6 to the low-voltage power rail. This causes a LOW voltage to be applied to the gate of P3, which turns on, coupling Vout to Vcc. However, N2 remaining on hard (because of IN_BAR HIGH maintaining the gate voltage of N2 HIGH) means that a link is established between the drain of N2 and GROUND through always-on N7. In a very short time, this will pull the drain of drain-gate-coupled N1 LOW. Since this point is connected directly to the gate of N6, this will shut N6 off after a certain interval. This in turn cuts Vout off from its link to Vcc and allows it to float. In those circumstances where Vout had not yet passed the threshold into HIGH, it never will. Those circumstances are the ones where Vout is looking into a large load. As set out above, the "fix" that is available for this, using a series of small invertors in place of one large one, degrades the through-put signal speed, something that cannot be tolerated in a number of important applications.

What is needed, therefore, is a differential-to-single-ended translator circuit that can service a wide range of loads with no basic design change. What is also needed is such a circuit that does not result in increased chip-area demands, a circuit that is simple and demands minimal power. Finally, what is needed is such a circuit that makes no compromises in speed in order to accommodate a wide range of loads.

SUMMARY OF THE INVENTION

It is an object of the present invention to produce a differential-to-single-ended translator circuit that can service a wide range of loads with no basic design change. Ancillary objects are that the circuit not result in increased chip-area demands or slower operation and that it require minimal power to operate.

The translator circuit of the present invention does away with the mid-switching pull-up-disconnect that afflicts the Kuo translator circuit in the presence of a large load. Furthermore, the translator circuit of the present invention accomplishes this without compromising throughput speed.

The basic difference between the prior-art translator and the translator of the present invention is that in the latter case the translator output, once being switched to logic HIGH, remains coupled to the high-voltage rail until the circuit is switched LOW (i.e., until the output is affirmatively switched). Similarly, in the present invention, when the output is switched LOW, it remains coupled to the low-voltage rail until it is affirmatively switched HIGH. This can be understood by reference to FIG. 2, which displays the converter stage of the present invention.

In this representation of the translator of the present invention, IPP and INN are voltage generators utilizing well-known techniques to drive the gates of P3 and N3, respectively, so as to ensure that those transistors are on but not on hard. That is, there will be a significant source-drain voltage drop across each of them as long as current flows through them. However, when current ceases, the source nodes of these transistors will go to Vcc and GROUND, respectively. For all practical purposes, they act just like passive resistors and can, indeed, be replaced by simple resistors should this prove advantageous in the manufacturing process or the implementation of the circuit.

With continuing reference to FIG. 2, assume that IN has been switched LOW (and as a consequence IN_BAR is HIGH). This turns on P4. The source of P4 being tied to Vout, this establishes a coupling between the drain of always-on P3 and Vout. Thus, P4 may be considered a pullup-facilitating device since, by coupling Vout to P3, it permits the current necessary to drive Vout HIGH to flow to the output node. Nevertheless, this current path will not be able to drive Vout all the way to Vcc. (Note that before P4 is turned on, its high side—i.e., its source node—and the low side of P3—i.e., its drain—will be at the same potential as the high-voltage power rail. It is only after current starts flowing through P3 that the voltage drop develops across it. In this regard, the combination of IPP and P3 also acts like a passive resistance device.) At the same time, another path is established, since IN_BAR being HIGH turns N1 on. This (because of the always-on N3 providing a path to GROUND) provides the gate voltage to P2 necessary to turn it on hard. At that point Vout is coupled through P2 to the high-voltage power rail, Vcc, and it is driven up to Vcc. Note that once P2 is on, nothing occurs to turn it off as long as IN_BAR is HIGH. Note also that, as Vout moves up to Vcc, current through P3 ceases (since there will no longer be the source-to-drain voltage drop across it needed to sustain a current). When the input logic changes, with IN_BAR going LOW, N1 switches off, and current flow through P1 ceases. When current through P1 ceases, the drain node of this drain-gate-coupled transistor goes to Vcc, resulting in a logic HIGH voltage being applied to the control node of P2, turning P2 off. But for the presence of P1, P2 would be left on, its control node isolated, when IN_BAR switched LOW. That in turn would lead to a direct coupling between the two power rails when N2 turned on (see below). In this sense P1, or whatever device serves the purpose of preventing the control node of P2 from becoming isolated, is an anchoring device.

A similar (and symmetric) mechanism drives Vout LOW when the differential input to the circuit shown in FIG. 2 switches so that IN_BAR goes LOW and IN goes HIGH. IN HIGH turns N2 on, thus coupling Vout to GROUND through N3. This provides current flow to Vout to drive it LOW; however, it will not by itself drive Vout to GROUND, because of the drop across N3. Concurrently, there will be another path being set up to provide current to drive Vout LOW. With IN_BAR LOW, P5 is turned on making the drain of P5 HIGH (though P3). This turns N4 on hard. N4 then directly links Vout to GROUND and continues to link it until the next affirmative switching of the circuit. Note that, since Vout remains coupled through N2 to the drain of N3, current through N3 will cease as Vout reaches GROUND. Note also that as long as IN_BAR remains LOW N4 will remain on hard, tying Vout to GROUND. The transistor N5 plays a role analogous to the of P1, ensuring that N4 turns off when IN_BAR switches HIGH.

Up to this point, the translator circuits have been shown as stand-alone circuits. Although it was indicated that they are used as part of a larger circuit, it was not stated that they themselves as circuit modules are normally equipped with an input amplifier stage that brings the differential signal level up to the point where the translator part of the circuit can function. In other words, when providing a translator circuit one must normally provide an appropriate input amplifier stage for the translator, should the available differential signal level not be sufficient to drive the converter (conversely, if that signal is already of sufficient magnitude, the converter can be used with no preamplification, i.e., with no input stage). This is indicated generically in FIG. 3, where a generic translator input stage is shown with the translator of the present invention. The entire translator circuit can now be thought of as consisting of an Input Stage and a Converter Stage. The particular Input Stage to be used with the Converter Stage of the present invention is determined by the application that the circuit is being used for. Similarly, the number and size of the invertors at the translator output will be determined by the particular application. One of the advantages of the present invention is that it provides a basic converter circuit design that can be used in a wide range of applications, that is, eliminating the need to do ad hoc converter designs depending on the load expected or on other specific aspects of the application. It should be emphasized that not only is the present translator circuit flexible in this regard, but that it is also able to satisfy translator needs in applications that require both speed and the ability to handle a large output load. This is not to say that such a circuit with a particular array of output invertors and a particular input stage can be stuck into any arbitrary circuit needing a translator. Rather it means that the translator design concepts of the present invention can be used in circuits presenting a wide range of output load impedances, as long as the invention's specific embodiment (size and number of output invertors, nature of input stage, etc.) is otherwise customized to the circuit demands. This customizing will relate to such peripheral items as size and number of output invertors, the gain of the translator's input stage, and the like.

Finally, it should be noted that, although—for the sake of concreteness—a particular form was assigned to the circuit of the present invention (i.e., the form shown for the converter stage in FIG. 2 and FIG. 3), the invention itself is broader than that form. The key aspect of the present invention, and that which distinguishes it from the prior art, lies in the fact that in switching the output signal to logic HIGH, the present circuit connects that signal directly to the high-voltage rail, and leaves it there for the duration of the time that the signal is supposed to be in that logic state.

PREFERRED EMBODIMENT

Figure 1:
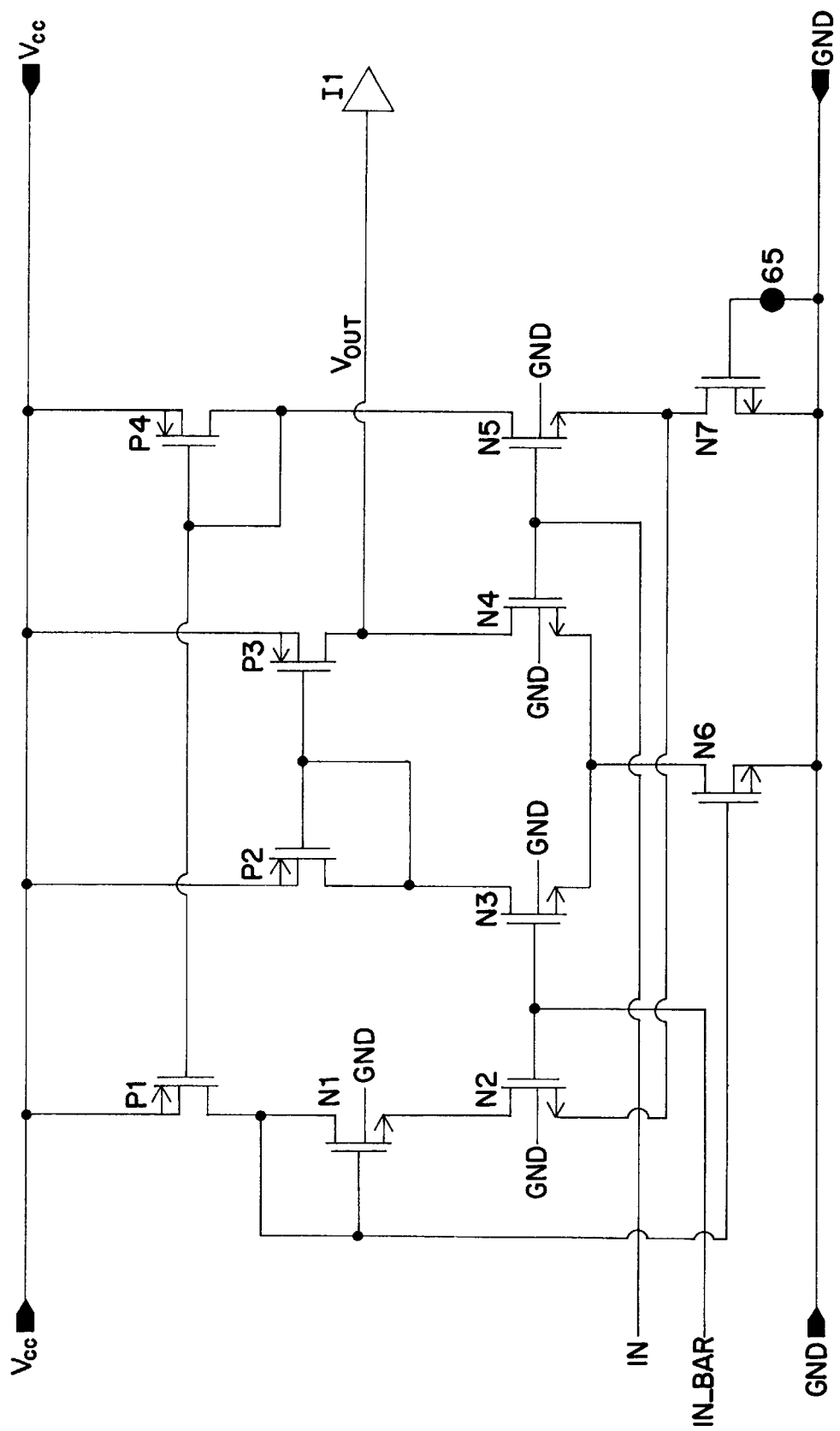
FIG. 1 (Prior Art) The converter stage of the prior-art translator circuit.
Figure 2:
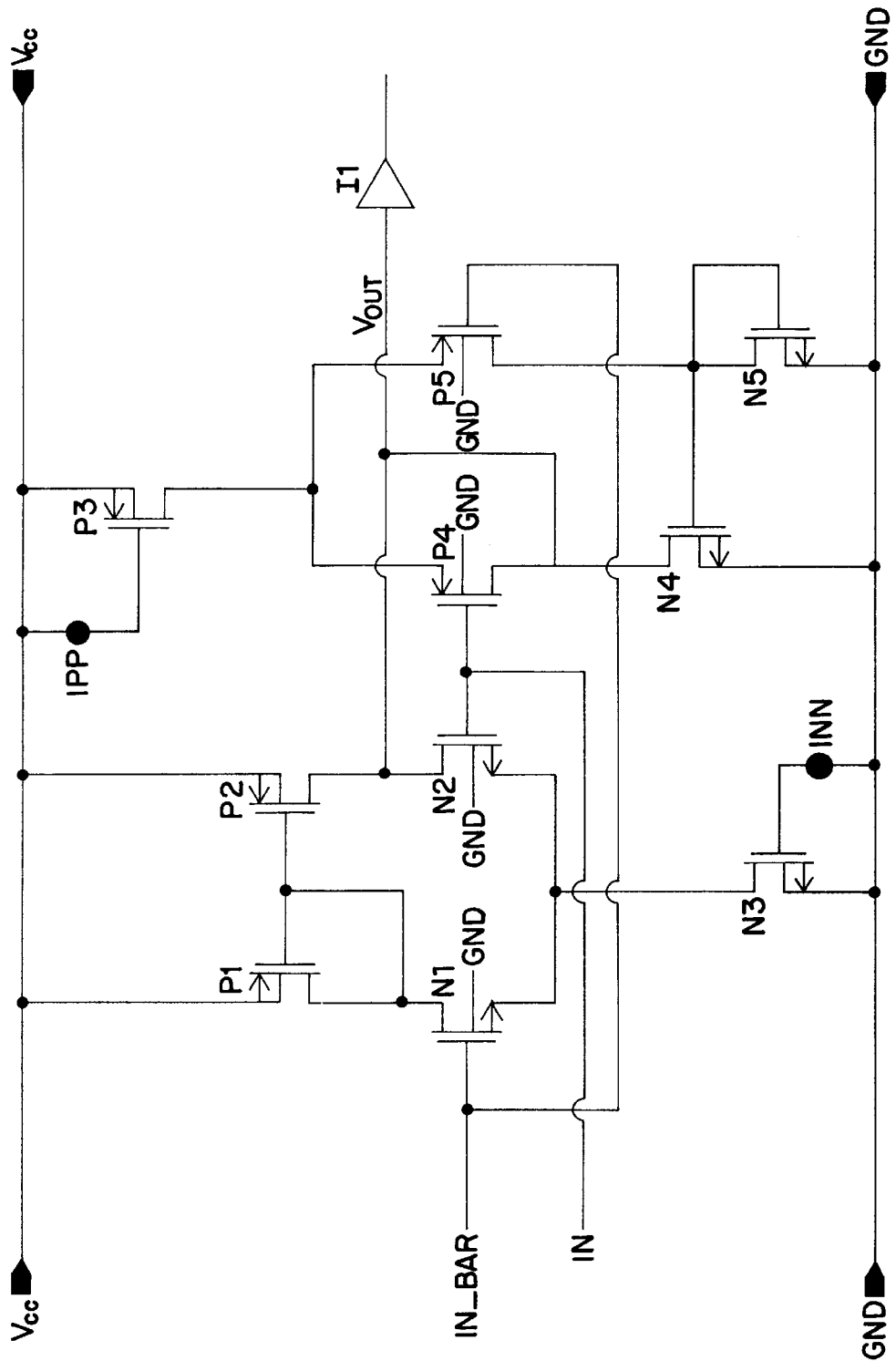
FIG. 2 The converter stage of the translator circuit of the present invention.
Figure 3:
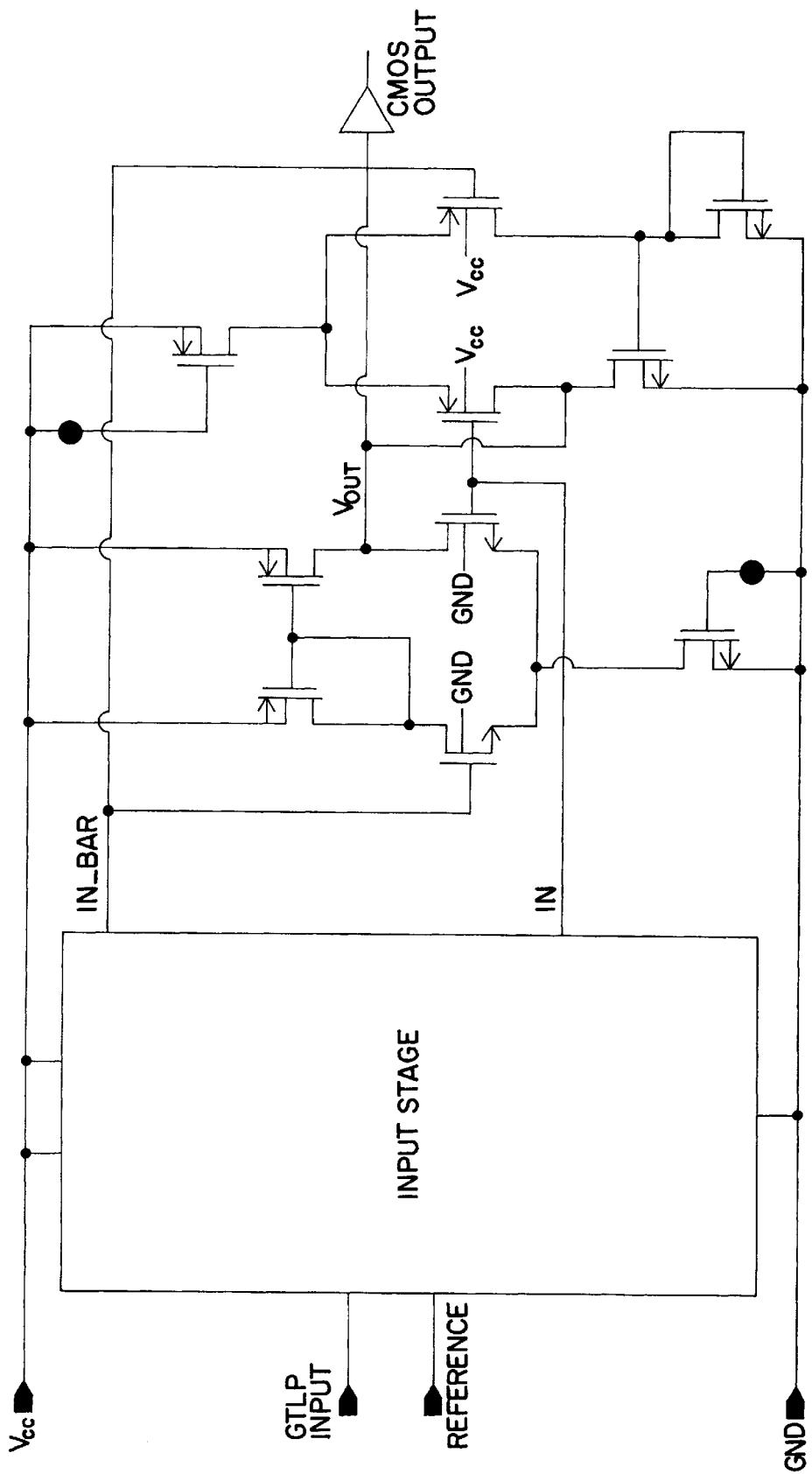
FIG. 3 The converter stage of the translator circuit of the present invention coupled to a generic input-amplifier stage.
Figure 4:
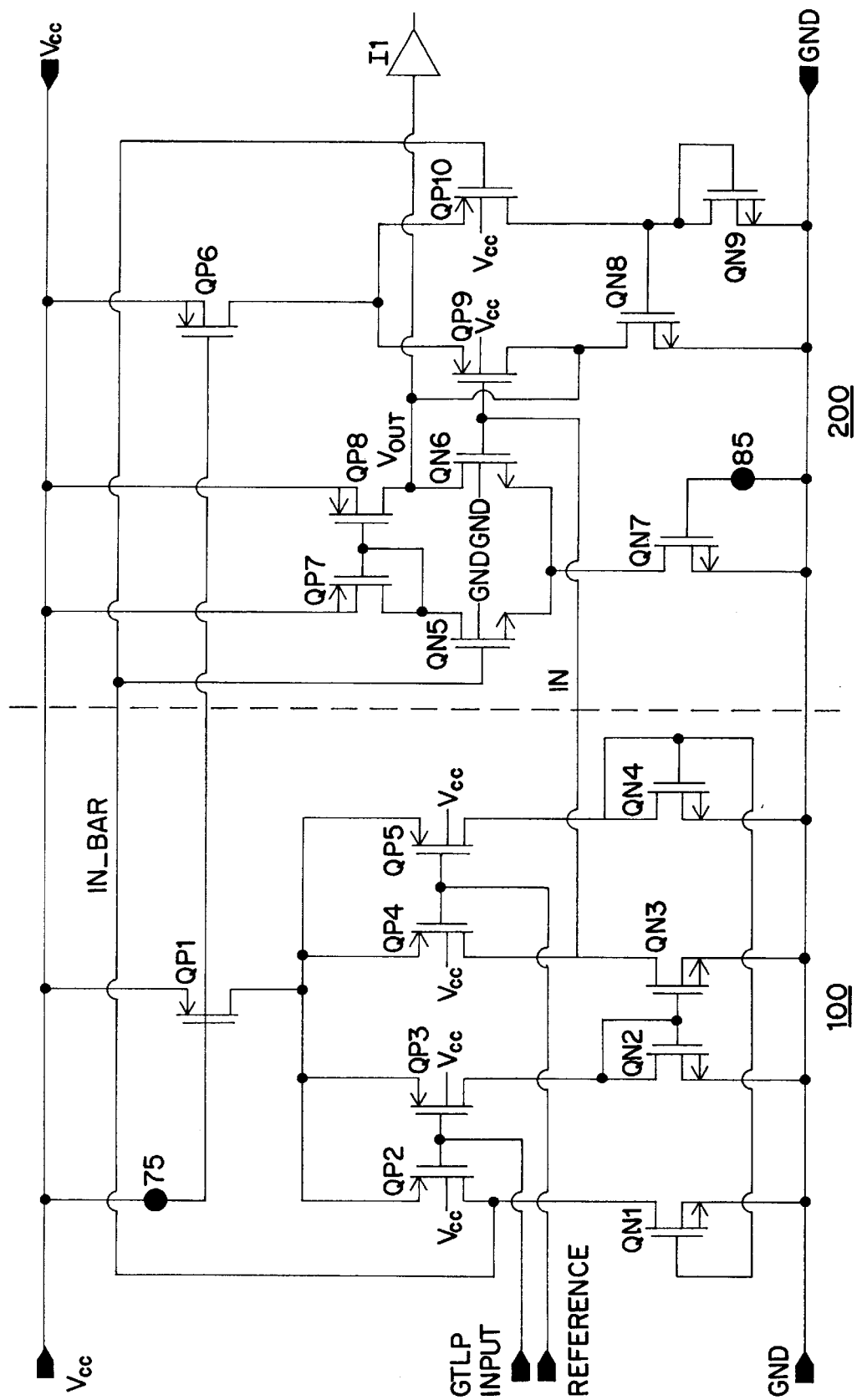
FIG. 4 The translator circuit representing the Preferred Embodiment of the present invention.

The Preferred Embodiment of the present invention is shown in FIG. 4, in which the generic input amplifier stage of FIG. 3 has now been made explicit. It should be clear from the earlier discussion that though one needs ultimately to use a specific input stage and other aspects peripheral to and supportive of the switching function, the present invention is not tied to any specific set of such parameters or aspects. For purposes of discussion of the Preferred Embodiment, the overall circuit is divided into an Input Stage 100 (shown to the left of the dashed vertical line in FIG. 4) and a Converter Stage 200 (to the right of the dashed line). The Input Stage 100 amplifies the differential input signal pair GTLP INPUT and REFERENCE to produce an intermediate differential signal pair IN and IN_BAR. The Converter Stage 200 then converts the amplified differential signal pair IN and IN_BAR into a single-ended output Vout, which in turn drives Inverter II. It is noted at the outset that, in the Preferred Embodiment about to be discussed, one of the differential input pair—REFERENCE—remains at a level of 1 volt regardless of whether the differential input is HIGH or LOW. That is, the logic value of the differential input signal is determined entirely by the level of GTLP INPUT. It is not intended that this specificity limit in any way the nature of the voltage levels on the differential input pair. Indeed, one skilled in the art can see that the comments regarding the operation of the Preferred Embodiment also apply to the situation where the voltage on o each member of the differential input pair varies. Also, it will be noted that in the Preferred Embodiment of the circuit, the dynamic range of the differential input voltage is relatively narrow, causing the switching of Vout from LOW to HIGH and from HIGH to LOW to take place over a very narrow input range, approximately ±50 mV about a reference level of 1 volt. Thus, for the differential input voltage, HIGH is 1.050 volts and LOW 0.950 volts. There is no intent to imply that that limitation applies to the general use of the invention of the present circuit. Indeed, the heart of the invention is the converter stage, and the conditions for which the Input Stage is designed are only incidental to the operation of the overall translator circuit. Similarly, it is noted that the Preferred Embodiment uses a single inverter at its output. In general the inverter circuit will be determined by the particular needs of the application in which the circuit of the present invention is used.

With continuing reference to FIG. 4, note that Voltage Generator 75 is used to drive the gates of QP1 and QP6. The voltage level is chosen so as to turn the transistors on, but not on hard. Reference Generator 75 establishes the saturation range currents in QP1 and QP6. With the source nodes of both QP1 and QP6 connected directly to the high-voltage rail Vcc, their respective drain nodes are always HIGH, though—for the reason stated—not as high as Vcc, unless another source of voltage increases the drain node voltage. Because QP1 and QP6, though they may have different areas, are otherwise fabricated identically, the fact that Reference Generator 75 ensures that they have the same voltage on their respective gate nodes means that the currents so produced through the respective transistors bear a simple relationship to one another. In particular, if they are fabricated to have the same area (the case in the Preferred Embodiment), these currents will be the same. Alternatively, if QP6 has twice the area as QP1, the current through the former will be twice that through the latter.

In the Preferred Embodiment, one of the differential inputs—REFERENCE—is always the same; in particular, it is fixed at 1 volt. A LOW differential input requires GTLP INPUT to be below one volt and a HIGH requires it to be above one volt. Thus the shortcut can be used of referring to GTLP INPUT as LOW or HIGH, with it implied that REFERENCE (fixed at 1 volt) is, respectively, HIGH or LOW.

When GTLP INPUT is LOW, QP2 and QP3 both turn on hard, sinking all the current from QP1 and thus causing the intermediate signal IN_BAR (now coupled to Vcc through QP2 and QP1) to go HIGH, though lower than Vcc by the drop across QP1. With QP3 on hard, the gate of QN2 goes HIGH (though not as HIGH as Vcc, for the same reason as stated above), turning QN2 on hard. Because the same gate voltage drives QN3 as drives QN2 and because the respective areas of QN3 and QN2 are equal to one another in the Preferred Embodiment (though not generally), the current flowing through QN2 is the same as that flowing through QN3. The current through QN3 pulls the intermediate signal IN, coupled to the drain of QN3, LOW. This causes QP9 to turn on hard, providing a path from Vcc through QP6 (which is on, conducting current—while in the saturation range—due to reference generator 75) to the drain of QP9. With Vout tied directly to the QP9 drain, Vout is now connected to Vcc through QP9 and QP6; Vout thus is switched HIGH (though, because of the voltage drop across QP6, lower than Vcc).

IN_BAR drives the gates of QNS and QP10. Thus, when HIGH, it turns QN5 on hard coupling the gate and drain of gate-drain-coupled QP7 to the drain of QN7. Since QN7 is on by virtue of its gate being driven by Reference Generator 85, this causes the gate voltages of QP7 and QP8 to go LOW. At this point, Vout is now connected to the Vcc power rail through QP8, which is on hard, and hence Vout is pulled the rest of the way to Vcc. But Vout is connected to the drain of QP6 through on-hard QP9. With the drain and source of QP6 both at Vcc, current passing through QP6 ceases.

To recapitulate, when GTLP INPUT switches LOW in the Preferred Embodiment of the present invention, Vout is pulled HIGH through two routes acting simultaneously and parallel, up to a point. The first route providing the current needed to switch Vout HIGH switches off before Vout is all the way to Vcc, leaving it to the other route to complete the pull-up to Vcc. Once this has been accomplished, Vout remains coupled directly to Vcc through a transistor (QP8) that is fully on. QP8 remains on, tying Vout to Vcc, until the circuit is next switched. This first route driving Vout HIGH arises because of the following sequence: (a) GTLP INPUT switches LOW, turning QP3 on hard; (b) this couples the gate of QN3 to logic HIGH thus turning QN3 on hard; (c) QN3 being on, its drain and intermediate input IN are pulled LOW, (d) intermediate input IN being LOW turns QP9 on hard, thus completing the link between Vcc and Vout through always-on QP6 (this completed current path is thus Vcc>QP6>QP9>Vout).

The other route providing current to drive Vout HIGH arises because of the following sequence: (a) GTLP INPUT switches LOW, turning QP2 on hard; (b) QP2 on hard makes intermediate input IN_BAR HIGH (though not as high as Vcc); (c) IN_BAR being HIGH drives the gate of QN5 HIGH, thus turning on QN5 hard; (d) QN5 on hard drives the gate of QP8 LOW, turning on QP8 hard; (e) QP8 on hard couples Vout directly to Vcc (this completed current path is thus Vcc>QP8>Vout).

Conversely, when GTLP INPUT switches HIGH, QP2 and QP3 are held off. REFERENCE simultaneously becomes LOW (while remaining at 1 volt), thus switching QP4 and QP5 on hard. With QP2 and QP3 off and QP4 and QP5 on hard, it is the latter pair that sink all the current from always-on QP1. Since the intermediate signal IN is connected directly to the drain of QP4, it is pulled HIGH, though lower than Vcc by the drop across QP1. Drain-gate-coupled QN4 is on, though not on hard. The current flowing through QN4 is the same as that through QN 1 by virtue of the equal areas of, and the connection between the respective gates of, these two transistors, both operating in the saturation region. With QN1 on, the intermediate input IN_BAR, connected directly to the drain of QN1 is pulled down to LOW (though not all the way to GROUND, because of the voltage drop supported by QN1).

With intermediate input IN pulled HIGH and intermediate input IN_BAR pulled LOW QN5 and QP10 are thereby held off and QN6 and QP9 are thereby turned on. This results in the QN7 current flowing through QN6 to Vout, thereby pulling Vout LOW (though higher than GROUND by the amount of voltage drop existing across QN7). Also the QP6 current—the same as the QP1 current because of the common gate voltage on the two transistors which, in the Preferred Embodiment, are of the same area—now flows thorough QP10 and gate-drain-connected QN9. With QP10 on hard, the gate of QN8 is pulled HIGH [(though lower than Vcc by the voltage drop across QP6)]. This turns QN8 on hard thereby connecting Vout to GROUND. That is, the turning on of QN8 pulls Vout the rest of the way to GROUND.

The voltage level of Vout then presents itself (by way of QN6) to the drain of QN7. With both drain and source of QN7 at GROUND, the current through QN7 ceases. Thus, it can be seen that the general symmetry of switching Vout (LOW to HIGH and HIGH to LOW) that is incorporated into the present invention is manifest in this particular Preferred Embodiment.

To recapitulate, just as with the switching of Vout to HIGH, there are two routes by which the drive current flows to Vout. In addition, though both routes contribute current necessary to cause Vout to switch LOW, only one of them continues to provide drive until Vout is actually at GROUND. That second route then couples Vout to GROUND for as long as the circuit is held in that state, that is, until GTLP INPUT next switches.

The first route for driving Vout LOW can be summarized as follows: (a) REFERENCE becomes LOW, switching on QP4; (b) QP4 on links intermediate input IN to the drain of always-on QP1 coupled to Vcc, thus switching intermediate input IN to HIGH; (c) IN switching HIGH turns on QN6, which couples Vout to GROUND through always-on QN7, making Vout LOW but not as low as GROUND, because of the drop across QN7(this completed current path providing the current drive to switch Vout LOW is thus GROUND>QN7>QN6>Vout).

The other route providing current to drive Vout LOW can be traced similarly. It results in a completed path GROUND>QN8>Vout.

Note the symmetry in operation of this circuit. Because of this, one can reverse the phase of the output from the Converter Stage simply by reversing the differential input pair, GTLP INPUT and REFERENCE.

It should again be noted that none of the incidental aspects of the Preferred Embodiment are intended to limit the invention herein claimed. These incidental aspects include but are not limited to (a) the particular, small excursion of the differential signal input (GTLP INPUT minus REFERENCE) associated with the Preferred Embodiment; (b) the invariance of the voltage level of one of the differential input pair, namely REFERENCE; (c) the degree to which the two routes by which Vout is pulled HIGH or LOW, respectively, are simultaneous in action.

I claim:

1. A translator circuit for translating a differential input signal including a first input signal and a second input signal that is the complement of the first input signal into a single output signal, the translator powered by a high-potential power rail and a low-potential power rail and having an output node, the circuit comprising:
   a. a first pull-up-facilitating device having a control node coupled to receive the first input signal;
   b. a second pull-up-facilitating device having a control node coupled to receive the second input signal;
   c. a first pulldown-facilitating device having a control node coupled to receive the first input signal;
   d. a second pulldown-facilitating device having a control node coupled to receive the second input signal;
   e. a first pull-up device having a high-potential node coupled to the high-potential power rail and a low-potential node coupled to the high potential nodes of said first pull-up-facilitating device and said second pull-up-facilitating device;
   f. a second pull-up device having a high-potential node coupled to the high-potential power rail and a low-potential node coupled to a high-potential node of said first pulldown-facilitating device and to the output node;
   g. a first pulldown device having a low-potential node coupled to the low-potential power rail and a high-potential node coupled to the low-potential nodes of said first pulldown-facilitating device and said second pulldown-facilitating device; and
   h. a second pulldown device having a low-potential node coupled to the low-potential power rail and a high-potential node coupled to a low-potential node of said first pull-up-facilitating transistor and to the output node.

2. The translator circuit as claimed in claim 1 further comprising an anchor device having a high-potential node coupled to the high-potential power rail and a low-potential node coupled to the control node of said second pull-up device.

3. The translator circuit as claimed in claim 2 further comprising a second anchor device having a low-potential node coupled to the low-potential power rail and a high-potential node coupled to the control node of said second pulldown device.

4. The translator circuit as claimed in claim 3 further comprising a reference generator coupled between the high-potential power rail and the control node of said first pull-up device.

5. The translator circuit as claimed in claim 4 further comprising a second reference generator coupled between the low-potential power rail and the control node of said first pulldown device.

6. The translator circuit as claimed in claim 5 wherein said reference generator turns said first pull-up device partially on and said second reference generator turns said first pull-down device partially on when the translator circuit is powered up.

7. The translator circuit as claimed in claim 6 wherein said first pull-up device and said second pull-up device are PMOS transistors.

8. The translator circuit as claimed in claim 7 wherein said first pulldown device and said second pulldown device are NMOS transistors.

9. The translator circuit as claimed in claim 8 wherein said anchor device is a PMOS transistor and said second anchor device is an NMOS transistor.

10. The translator circuit as claimed in claim 8 wherein said anchor device is configured to turn on said second pull-up device when said second pull-down-facilitating device is off.

11. The translator circuit as claimed in claim 10 wherein said second anchor device is configured to turn on said second pulldown device when said second pull-up-facilitating device is off.

12. The translator circuit as claimed in claim 11 wherein said anchor device is a gate-drain coupled PMOS transistor with the source coupled to the high potential rail and the drain coupled to the high potential node of the second pulldown facilitating device and said second anchor device is a gate-drain coupled NMOS transistor with the source coupled to the low potential rail and the drain coupled to the low potential node of the second pull-up-facilitating device.

13. The translator circuit as claimed in claim 1 wherein the output node is coupled to the input of an inverter.

14. The translator circuit as claimed in claim 1 further comprising an input stage coupling the first and second input signals to said first pull-up facilitating device, said second pull-up-facilitating device, said first pulldown-facilitating device, and said second pulldown-facilitating device.

15. The translator circuit as claimed in claim 1 wherein said first pull-up device and said first pulldown device are resistors.

* * * * *